(12) United States Patent
Li

(10) Patent No.: US 9,882,486 B2
(45) Date of Patent: Jan. 30, 2018

(54) SWITCHING CONTROL CIRCUIT AND CONTROL METHOD FOR A MULTI-CHANNEL SWITCHING CIRCUIT

(71) Applicant: Silergy Semiconductor Technology (Hangzhou) LTD, Hangzhou, ZheJiang Province (CN)

(72) Inventor: Junjie Li, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 15/446,133

(22) Filed: Mar. 1, 2017

(65) Prior Publication Data

US 2017/0264198 A1     Sep. 14, 2017

(30) Foreign Application Priority Data

Mar. 8, 2016   (CN) .......................... 2016 1 0123766

(51) Int. Cl.
*H02M 3/158* (2006.01)
*H02M 3/157* (2006.01)
*H02M 1/00* (2006.01)
*H02M 1/084* (2006.01)

(52) U.S. Cl.
CPC .......... *H02M 3/158* (2013.01); *H02M 3/157* (2013.01); *H02M 1/0845* (2013.01); *H02M 2001/0025* (2013.01)

(58) Field of Classification Search
CPC ................. H02M 3/157; H02M 3/158; H02M 2001/0025; H02M 1/084; H02M 1/0845
See application file for complete search history.

(56) References Cited

U.S. PATENT DOCUMENTS

| 8,067,925 | B2 | 11/2011 | Grimm |
| 8,766,833 | B1* | 7/2014 | Bogner ............... H03M 1/1014 341/118 |
| 9,130,456 | B2 | 9/2015 | Yu et al. |
| 9,317,019 | B2 | 4/2016 | Huang |
| 9,673,732 | B2* | 6/2017 | Deboy .................... H02M 7/49 |
| 2013/0148387 | A1 | 6/2013 | Ren et al. |

\* cited by examiner

*Primary Examiner* — Jue Zhang
*Assistant Examiner* — Lakaisha Jackson
(74) *Attorney, Agent, or Firm* — Michael C. Stephens, Jr.

(57) ABSTRACT

A switching control circuit for controlling a multi-channel switching circuit can include: a logic control circuit that receives an external operation signal, and generates an enable signal, a trigger signal, and an order signal; a reference voltage regulation circuit that receives the enable signal, the trigger signal, the order signal, and a plurality of input voltage signals, and generates an adjustable reference voltage signal, where the reference voltage regulation circuit is also configured to select one of the plurality of input voltage signals based on the order signal; a feedback control circuit that receives the reference voltage signal, the plurality of input voltage signals, and the output voltage signal, and generates a feedback control signal; and a channel selection circuit that receives the order signal and the feedback control signal, and generates switching control signals to control switching operations of the multi-channel switching circuit.

10 Claims, 11 Drawing Sheets

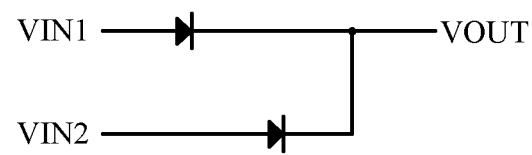
FIG. 1A (conventional)

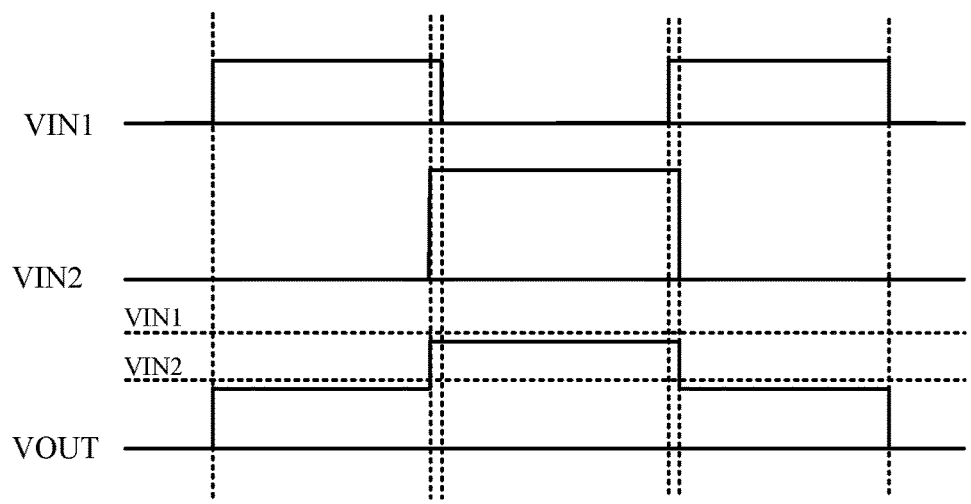
FIG. 1B (conventional)

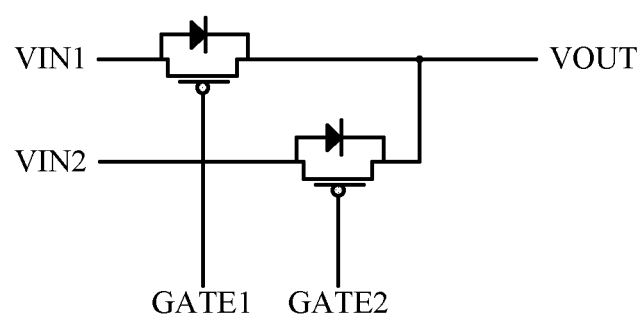
FIG. 2A (conventional)

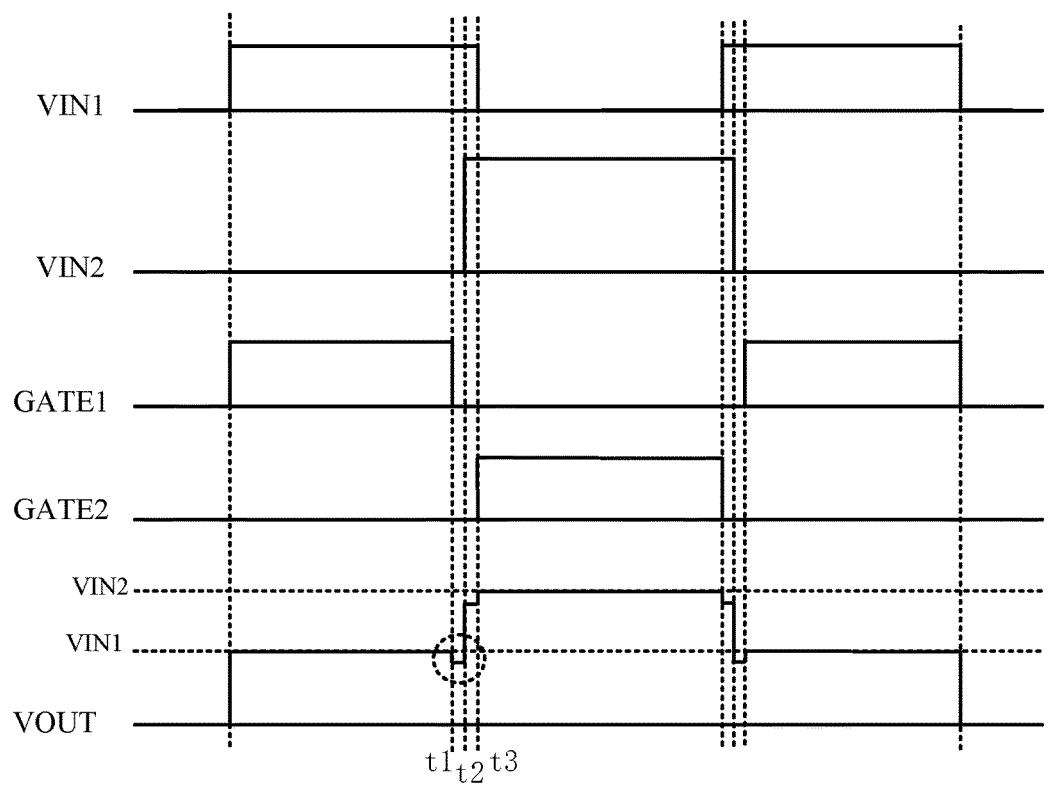
FIG. 2B (conventional)

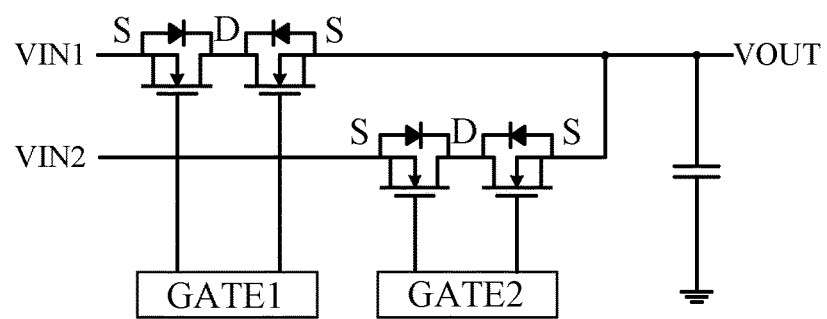
FIG. 3A (conventional)

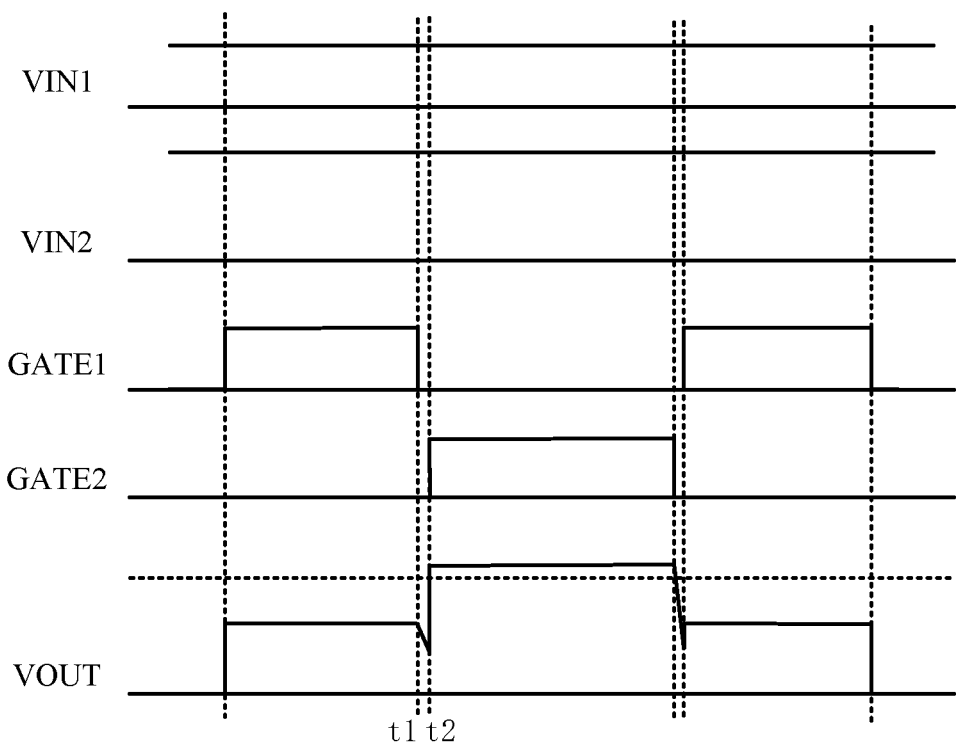
FIG. 3B (conventional)

SWITCHING CONTROL CIRCUIT AND CONTROL METHOD FOR A MULTI-CHANNEL SWITCHING CIRCUIT

RELATED APPLICATIONS

This application claims the benefit of Chinese Patent Application No. 201610123766.8, filed on Mar. 8, 2016, which is incorporated herein by reference in its entirety.

FIELD OF THE INVENTION

The present invention generally relates to the field of switching power supplies, and more particularly to switching control circuits and methods.

BACKGROUND

Switch mode power supplies can efficiently convert electrical power from a source to a load, or to several different loads, with each corresponding to a different output. The main transistor of a switching-mode supply can switch between on and off states at a given operating frequency, and voltage regulation can be achieved by varying the ratio of the on-to-off time of the main transistor. Switch mode power supplies may have relatively high power conversion efficiency, as compared to other types of power converters. Switch mode power supplies may also be substantially smaller and lighter than a linear supply due to the smaller transformer size and weight.

BRIEF DESCRIPTION OF THE DRAWINGS

FIG. 1A is a schematic block diagram of a first example voltage switching circuit.
FIG. 1B is a waveform diagram of example operation the circuit of FIG. 1A.
FIG. 2A is a schematic block diagram of a second example voltage switching circuit.
FIG. 2B is a waveform diagram of example operation of the circuit of FIG. 2A.
FIG. 3A is a schematic block diagram of a third example voltage switching circuit.
FIG. 3B is a waveform diagram of example operation of the circuit of FIG. 3A.

DETAILED DESCRIPTION

Figure 4:
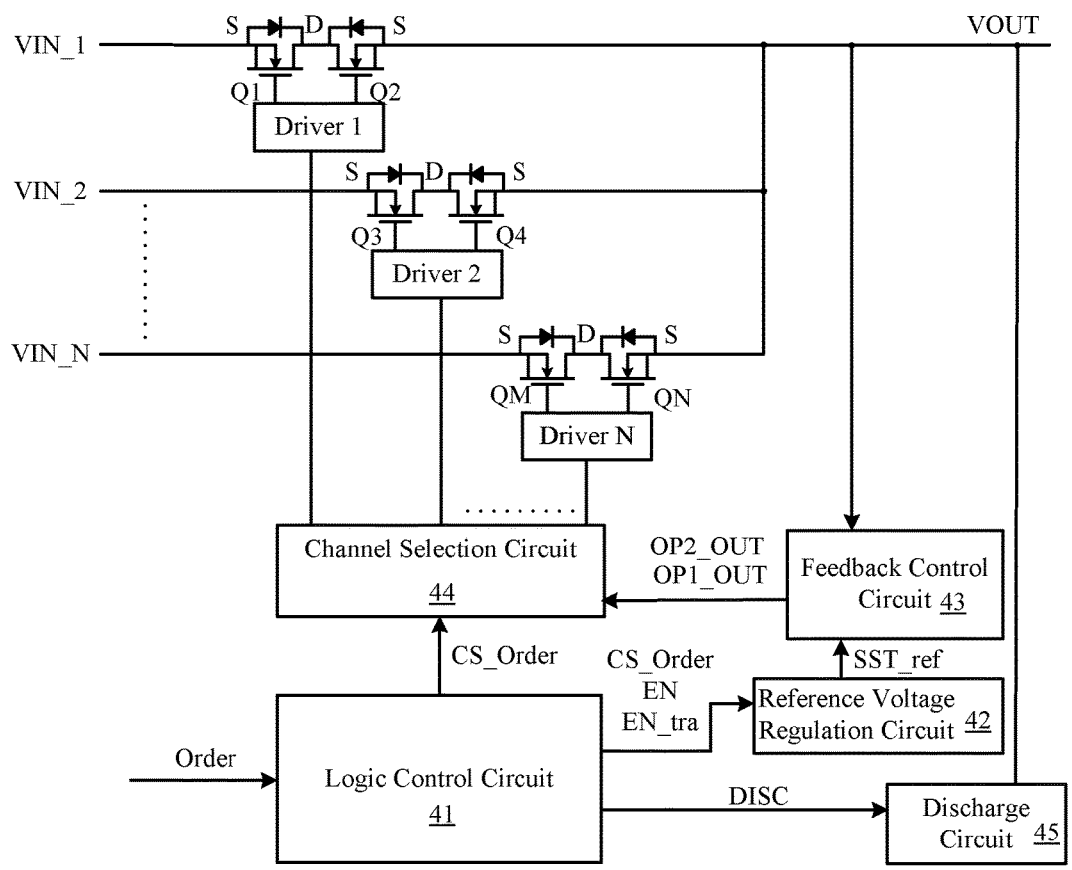
FIG. 4 is a schematic block diagram of an example switching control circuit, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In some applications with a plurality of input ports but only one output port, different input power supplies may be switched in order to obtain a desired output voltage signal. Referring now to FIG. 1A, shown is a schematic block diagram of a first example voltage switching circuit. FIG. 1B shows a waveform diagram of example operation the circuit of FIG. 1A. Here, the circuit with only two input ports is described as an example, and the input ports may be switched based on the property of unidirectional conductivity of diodes.

For each channel, one diode can be coupled to an input port at its anode terminal, and to an output port at its cathode terminal. When voltage VIN1 at the first input port is required, voltage VIN1 can be coupled to the input port, and voltage VOUT may be obtained by subtracting the voltage drop of a diode from voltage VIN1. When voltage VIN2 at the second input port is required, voltage VIN2 can be coupled to the input port, and if voltage VIN2 is greater than voltage VIN1, voltage VOUT can be obtained by subtracting the voltage drop of a diode from voltage VIN2. Voltage VIN1 at the first input port may also be shut down or otherwise disabled in this case. In this approach, a diode voltage drop exists between voltage VOUT and voltage VIN1 (or VIN2) during operation, and relatively large power losses may be generated when a load current is large. As a result, this approach may not be suitable for applications having high accuracy demands or heavy load requirements.

Referring now to FIG. 2A, shown is a schematic block diagram of a second example voltage switching circuit. FIG. 2B, shows a waveform diagram of example operation of the circuit of FIG. 2A. For each channel, a MOS transistor may serve as a switching circuit that is coupled to an input port. When voltage VIN1 at the first input terminal is required, the MOS transistor coupled to voltage VIN1 can be turned on, and when voltage VIN2 at the second input terminal is required, the MOS transistor coupled to voltage VIN2 can be turned on while the MOS transistor in the first channel may be slightly turned off in advance. As compared to the above approach, the system losses can be reduced by using the transistors, but in order to achieve unidirectional conduction that prevents current inversion, the MOS transistor may be turned off before the voltage is completely switched (e.g., time t1 to t3 in FIG. 2B). Thus, the output voltage may be less than the previous value by a diode voltage drop (e.g., VOUT during time t1 to time t2). However, in some applications (e.g., USB PD), even the voltage drop that equals a diode voltage drop may still be far beyond the allowable range.

Referring now to FIG. 3A, shown is a schematic block diagram of a third example voltage switching circuit. FIG. 3B shows a waveform diagram of example operation of the circuit of FIG. 3A. In this example, when the output voltage is switched to voltage VIN2 at the second input terminal from voltage VIN1 at the first input terminal, the transistor in the first channel may initially be turned off, and then the transistor in the second channel can be turned on. Also, output voltage VOUT may be maintained by an output capacitor during a predetermined time period (e.g., from time t1 to time t2 in FIG. 3B). However, during the switching process there may be a drop in the output voltage, and the value of this drop can be related to the load, the output capacitor, and the dead time of signals GATE1, GATE2. When the output capacitor has a relatively low value, unacceptable output voltage drop may be generated, and in some applications, the upper limit of the output capacitor may be limited, which can result in greater output voltage fluctuations.

In one embodiment, a switching control circuit for controlling a multi-channel switching circuit having input terminals respectively coupled to a plurality of input voltages, and output terminals coupled to an output terminal to provide an output voltage signal, can include: (i) a logic control circuit configured to receive an external operation signal, and to generate an enable signal, a trigger signal, and an order signal; (ii) a reference voltage regulation circuit configured to receive the enable signal, the trigger signal, the order signal, and a plurality of input voltage signals, and to generate an adjustable reference voltage signal, where the reference voltage regulation circuit is configured to select one of the plurality of input voltage signals based on the order signal; (iii) a feedback control circuit configured to receive the reference voltage signal, the plurality of input voltage signals, and the output voltage signal, and to generate a feedback control signal; and (iv) a channel selection circuit configured to receive the order signal and the feedback control signal, and to generate switching control signals to control switching operations of the multi-channel switching circuit.

Referring now to FIG. 4, shown is a schematic block diagram of an example switching control circuit, in accordance with embodiments of the present invention. In this example, the switching control circuit is used to control a multi-channel switching circuit that includes first through Nth switching circuits. The first switching circuit can include transistors Q1 and Q2, the second switching circuit can include transistors Q3 and Q4, and so on through the Nth switching circuit, which can include transistors QM and QN. The multi-channel switching circuit includes input terminals respectively coupled to a plurality of input voltages (e.g., VIN_1 through VIN_N). Also, output terminals of all channels of the multi-channel switching circuit can be coupled to a common node as an output terminal to provide expected output voltage signal VOUT.

The switching control circuit can include logic control circuit 41, reference voltage regulator 42, feedback control circuit 43, and channel selection circuit 44. For example, logic control circuit 41 can receive external operation signal "Order," and may generate enable signal EN, trigger signal EN_tra, and order signal CS_Order. External operation signal Order can represent operation information (e.g., start, channel switch, etc.). When the external operation signal is asserted, enable signal EN can be activated, the trigger signal can be activated or deactivated based on the external operation signal, and the order signal can output the channel switching information according to the external operation signal. For example, logic control circuit 41 may include a trigger, a delay circuit, and/or components with similar functionality.

Reference voltage regulator 42 can receive enable signal EN, trigger signal EN_tra, order signal CS_Order, and a plurality of input voltage signals VIN_1 to VIN_N, and may generate adjustable reference voltage signal SST_ref. Reference voltage regulator 42 can determine which one of a plurality of input voltage signals should be coupled in according to order signal CS_Order. Also, the reference voltage signal may be different when the input voltage signals are different. Feedback control circuit 43 can receive reference voltage signal SST_ref, a plurality of input voltage signals VIN_1 to VIN_N, and output voltage signal VOUT of the multi-channel switching circuit, and may generate feedback control signals OP1_OUT and OP2_OUT. Channel selection circuit 44 can receive order signal CS_Order and feedback control signals OP1_OUT and OP2_OUT, and may generate switching control signals in order to control the switches of the multi-channel switching circuit. For example, the channel selection circuit can be a multiplexer circuit.

Figure 5:
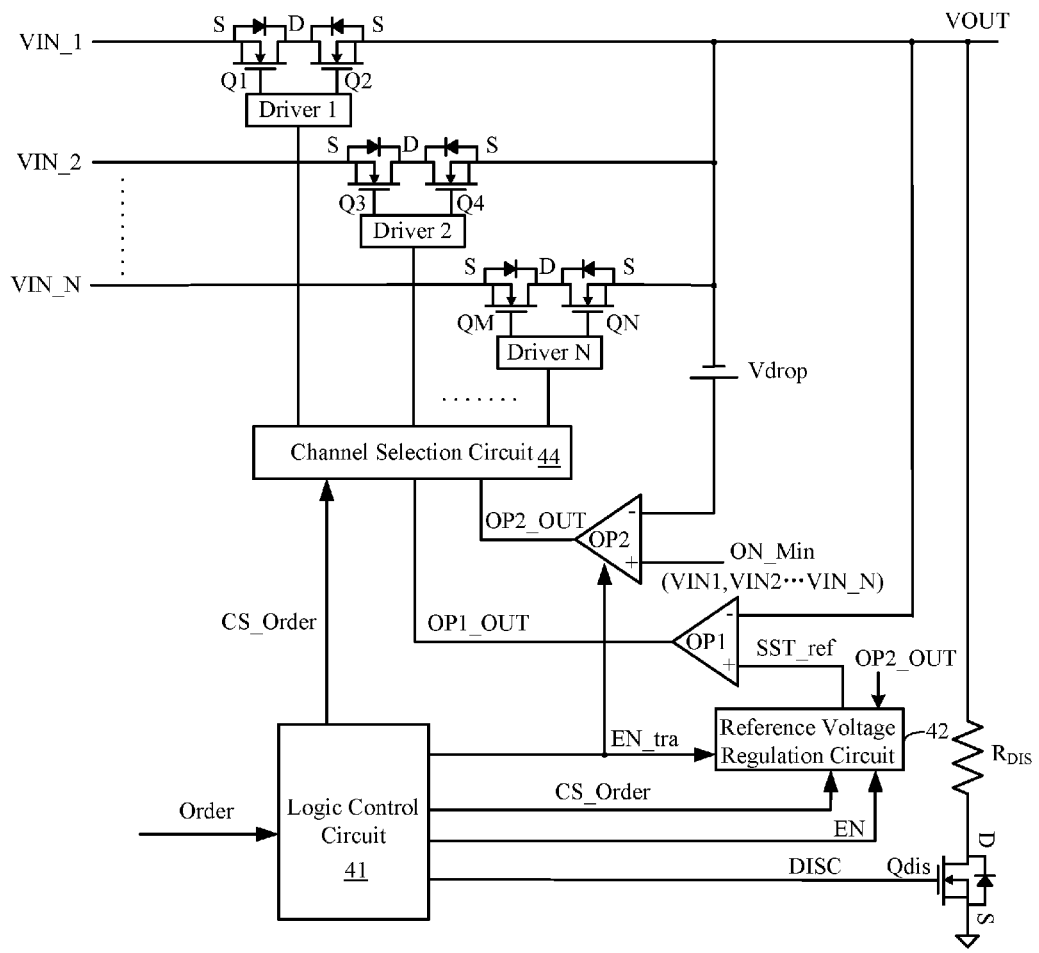
FIG. 5 is a more detailed schematic block diagram of the example switching control circuit, in accordance with embodiments of the present invention.

Referring now to FIG. 5, shown is a more detailed schematic block diagram of the example switching control circuit, in accordance with embodiments of the present invention. In this example, feedback control circuit 43 can include a first feedback circuit having a first operational amplifier and a second feedback circuit having a second operational amplifier. The first operational amplifier may have a non-inverting input terminal for receiving reference voltage signal SST_ref, and an inverting input terminal for receiving output voltage signal VOUT of the multi-channel switching circuit, so as to output feedback control signal OP1_OUT. The second operational amplifier may have a non-inverting input terminal for receiving a minimum value of a plurality of input voltage signals, such as ON_min (VIN_1 . . . VIN_N), and an inverting input terminal for receiving the output voltage signal, so as to output feedback control signal OP2_OUT. The minimum value herein can be the smaller one between two input voltage signals to be switched. In this particular example, the feedback control circuit may also include voltage source Vdrop having a cathode coupled to an output terminal of the multi-channel switching circuit, and an anode coupled to an inverting input terminal of the second operational amplifier.

Figure 6A:
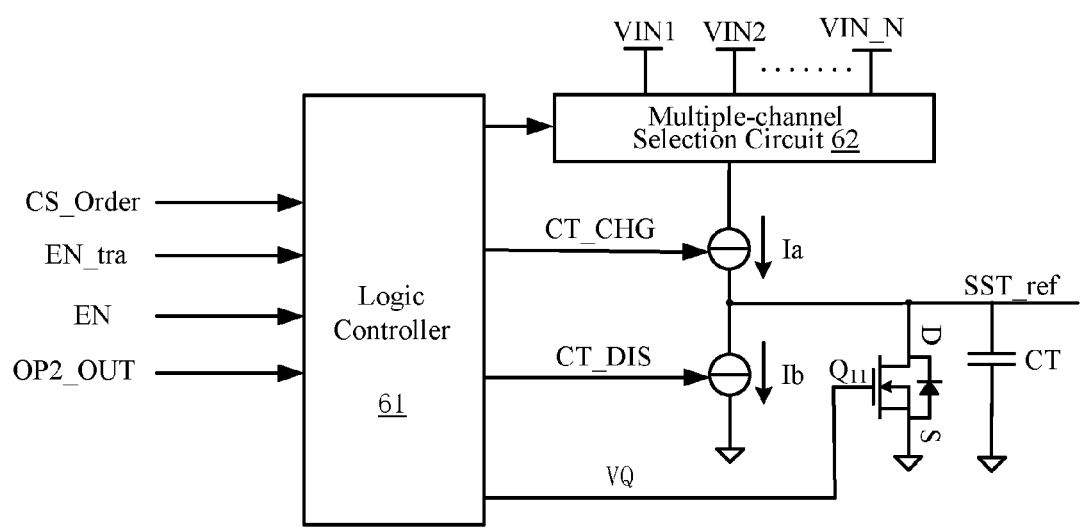
FIG. 6A is a schematic block diagram of an example reference voltage regulator configured for the switching control circuit of FIG. 5, in accordance with embodiments of the present invention.

Referring now to FIG. 6A, shown is a schematic block diagram of an example reference voltage regulator configured for the switching control circuit of FIG. 5, in accordance with embodiments of the present invention. In this example, the reference voltage regulator can include logic controller 61, multiple-channel selection circuit 62, and a charge and discharge circuit. Logic controller 61 may receive enable signal EN, trigger signal EN_tra, order signal CS_Order, and feedback signal OP2_OUT, and may generate charge signal CT_CHG and discharge signal CT_DIS. The logic controller may be a circuit implemented by logic components (e.g., a trigger, a delay circuit, etc.). The multiple-channel selection circuit can determine which one of a plurality of input voltage signals is to be coupled in according to order signal CS_Order.

The charge and discharge circuit can include charge current source Ia, discharge current source Ib, switch Q11, and capacitor CT. charge current source Ia may have a first terminal coupled to an output terminal of the multiple-channel selection circuit, and a second terminal coupled to a first terminal of the first capacitor. Discharge current source Ib, switch Q11, and capacitor CT can be coupled in parallel, and the second terminal of capacitor CT can connect ground. Also, charge current source Ia can receive charge signal CT_CHG, and may charge capacitor CT when the charge signal is active. Discharge current source Ib can discharge signal CT_DIS, and may discharge capacitor CT when the discharge signal is active.

Figure 6B:
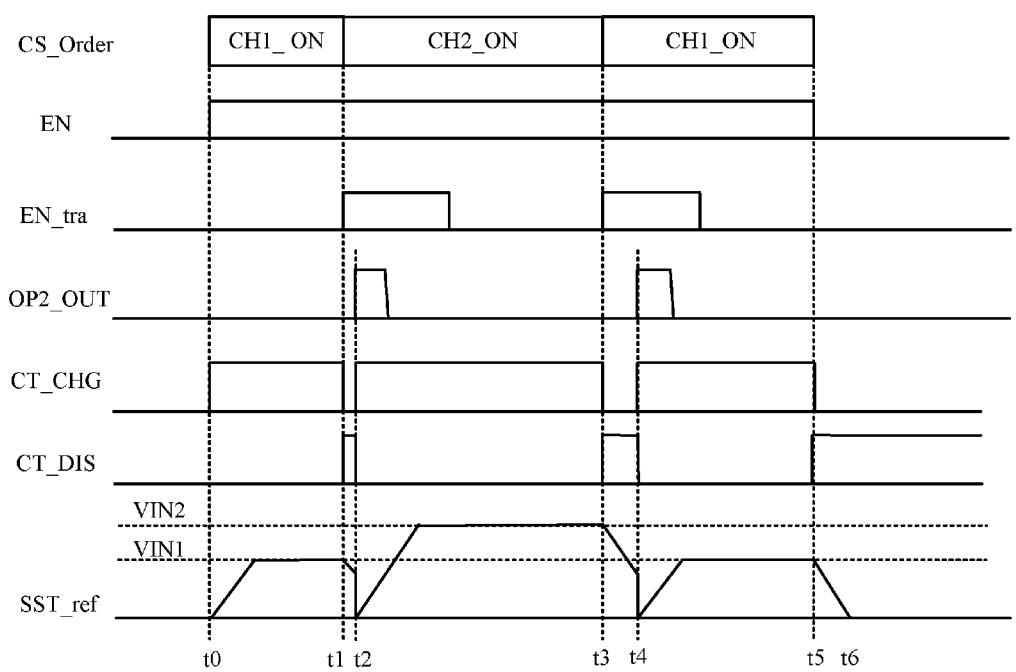
FIG. 6B is a waveform diagram of example operation of the circuit of FIG. 6A, in accordance with embodiments of the present invention.

Referring now to FIG. 6B, shown is a waveform diagram of example operation of the circuit of FIG. 6A, in accordance with embodiments of the present invention. In this example of two channels, the first switching circuit can initially be operational, and then this is switched to the second switching circuit. Also, input voltage VIN1 is less than input voltage VIN2 in this particular example. At time t0, order signal CS_Order can indicate the first switching circuit is enabled (e.g., channel CH1_ON is active). Input voltage VIN1 may be provided to multiple-channel selection circuit 62, and be transferred as the output voltage to charge current source Ia via the multiple-channel selection circuit. Enable signal EN can be active high, charge signal CT_CHG output by the logic controller can also be active high, and charge current source Ia may charge capacitor CT. Thus, the voltage at the first terminal of capacitor CT may linearly increase to VIN1, and the voltage across capacitor CT may be provided to feedback control circuit 43 as reference voltage signal SST_ref.

At time t1, order signal CS_Order can indicate that the second switching circuit is enabled (e.g., channel CH2_ON is active). Input voltage VIN2 may be provided to multiple-channel selection circuit 62, and can be coupled to charge current source Ia. Enable signal EN may remain high, and trigger signal EN-tra can go active high. The charge signal turns can be deactivated to a low level, and the discharge signal may be activated to a high level. Charge current source Ia may be disabled, and discharge current source Ib can discharge capacitor CT, such that the voltage across capacitor CT (e.g., reference voltage signal SST_ref) can begin decreasing until time t2. Feedback control signal OP2_OUT can go active high, and logic controller 61 may activate switching control signal VQ to turn on switch Q11, and reference voltage signal SST_ref may rapidly decrease to zero. At this time, charge signal CT_CHG can go high, discharge signal CT_DIS can go low, and charge current source Ia may charge capacitor CT. Also, the voltage at the first terminal of capacitor CT may linearly increase to VIN2, and the voltage across capacitor CT can be provided to feedback control circuit 43 as reference voltage signal SST_ref.

Thus, the regulation of the reference voltage signal may be completed during the switch from the first switching circuit to the second switching circuit, and the variation procedure of the signals during the switching from the second switching circuit to the first switching circuit may be as shown from time t3 to time t5. In this example, as the reference voltage signal is regulated along with the change of the input voltage, the associated change of the output voltage can be performed during the switching of the input voltage so as to reduce the conversion time.

Figure 7:
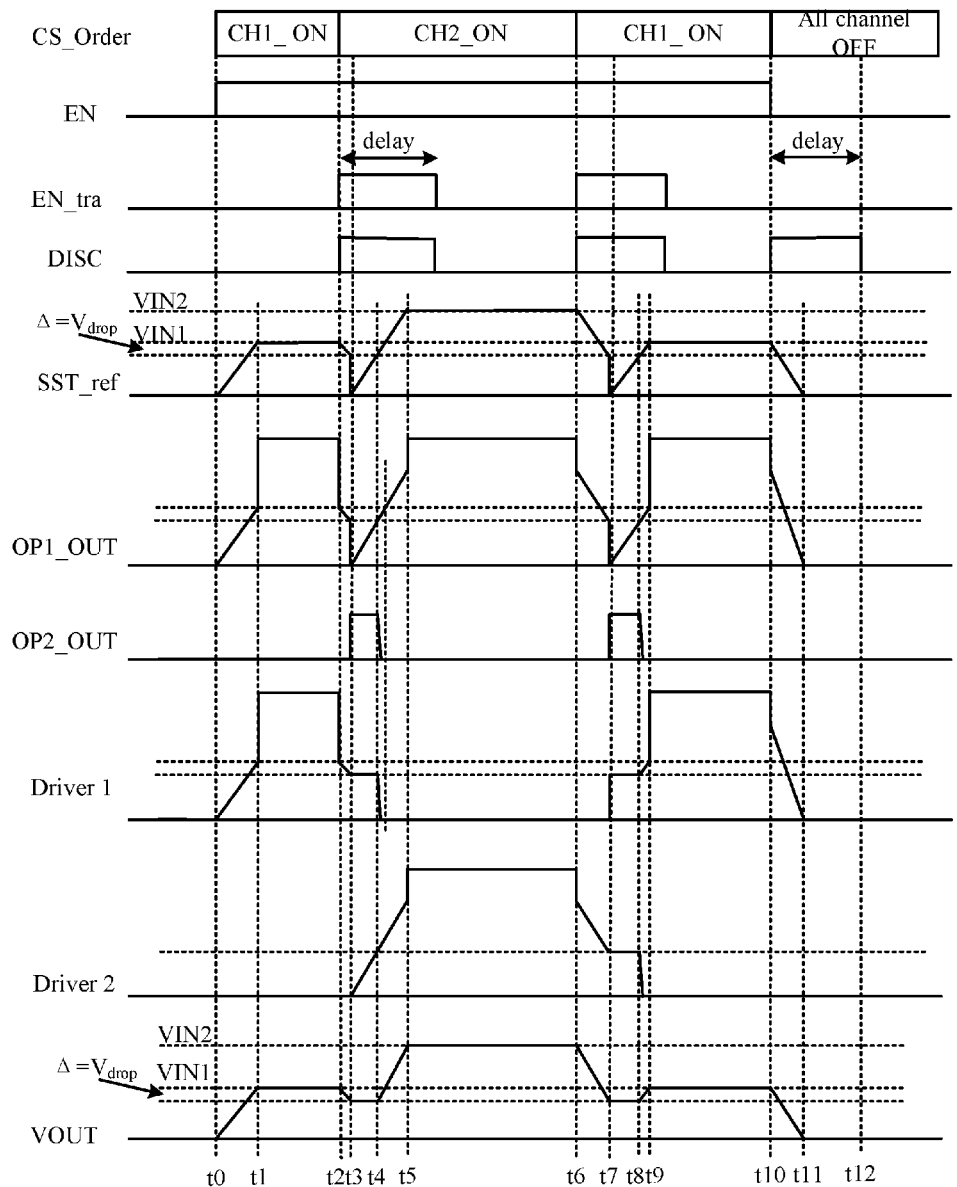
FIG. 7 is a waveform diagram of example operation of the circuit of FIG. 5, in accordance with embodiments of the present invention.

The following may describe the specific switching procedure between different input voltages in conjunction with FIGS. 5, 6B, and 7 according to embodiments of the present invention. In this example, the circuit with two channels is described, and the system is started with the first switching circuit enabled, then the operation is switched from the first switching circuit to the second switching circuit, followed by being switched from the second switching circuit back to the first switching circuit. Further, the first input voltage is less than the second input voltage in this particular example.

In one embodiment, a method of controlling a multi-channel switching circuit having input terminals respectively coupled to a plurality of input voltages, and output terminals coupled to an output terminal to provide an output voltage signal, can include: (i) receiving an operation signal, and generating an enable signal, a trigger signal, and an order signal; (ii) generating an adjustable reference voltage signal based on the enable signal, the trigger signal, the order signal, and the plurality of input voltage signals; (iii) selecting one of the input voltage signals according to the order signal; (iv) generating a feedback control signal in response to the reference voltage signal, the plurality of input voltage signals, and the output voltage signal; and (v) generating switching control signals to control the switches of the multi-channel switching circuit in response to the order signal and the feedback control signal.

Referring now to FIG. 7, shown is a waveform diagram of example operation of the circuit of FIG. 5, in accordance with embodiments of the present invention. At time t0, logic control circuit 41 can receive operation signal Order, and order signal CS_Order may indicate the first channel CH1_ON. Channel selection circuit 44 may receive order signal CS_Order, and can transmit feedback control signal OP1_OUT to driver 1, and enable signal EN can go active high. During the operation procedure of the reference voltage regulation circuit, reference voltage signal SST_ref can begin rising, and then feedback control signal OP1_OUT, the output of driver 1, and output voltage VOUT, can begin rising. At time t1, reference voltage signal SST_ref can increase to the level of VIN1, feedback control signal OP1_OUT can reach its maximum value, switches Q1 and Q2 of the first switching circuit may be fully on, and the value of output voltage VOUT can be VIN1.

At time t2, operation signal "Order" may indicate the second switching circuit is enabled, order signal CS_Order can indicate channel CH2_ON, and trigger signal EN_tra may go active high. Also, discharge signal DIS can be activated at a high level, the reference voltage signal SST_ref can begin to decrease, and feedback control signal OP1_OUT may decrease. Discharge circuit 45 may be enabled, discharge switch Qdis can turn on, and the discharge resistor can discharge output voltage VOUT to decrease the level of VOUT. In order to facilitate the control the discharge circuit, the discharge time of discharge circuit 45 may be set (e.g., by a user based on circuit requirements) to be a predetermined value.

At time t3, output voltage VOUT can decrease to the difference between VIN1 and Vdrop, and feedback control signal OP2_OUT can go active high. Channel selection circuit 44 can couple feedback control signal OP2_OUT to driver 1, and feedback control signal OP1_OUT to driver 2, and reference voltage signal SST_ref may be reduced to zero. From time t3 to t4, reference voltage signal SST_ref may gradually rise, and the output of driver 2 can also gradually rise in the function of feedback control signal OP1_OUT. In this way switches Q3 and Q4 of the second switching circuit can be "softly" or slowly started/enabled. In addition, output voltage VOUT may remain at the value of VIN1−Vdrop at this time.

Because the smaller one of VIN1 and VIN2 (e.g., VIN1) is input to the positive input terminal of the second operational amplifier, and voltage OUT+Vdrop is input to the inverting input terminal, output voltage VOUT may remain at VIN1−Vdrop based on the operating principles of the operational amplifier. Voltage Vdrop of the first voltage source can be a drop voltage of output voltage OUT set by the system, and the value may be far less than the diode voltage drop. In this way, relatively large voltage drops of output voltage VOUT can be substantially avoided during the switching procedure.

At time t4, reference voltage signal SST_ref may rise to a certain value (e.g., VIN1−Vdrop), and the output of driver 2 can increase. Also, switches Q3 and Q4 of the second switching circuit may be gradually turned on, and finally, output voltage VOUT may be greater than the difference between VIN1 and Vdrop. When output voltage VOUT reaches the difference between VIN1 and Vdrop, the second feedback control signal OP2_OUT may go inactive low, the output of driver 1 may be gradually decreased to zero, and the switches of the first switching circuit may be off. In this configuration, switches of the first switching circuit can be completely off before the output voltage rises to input voltage VIN1 because of voltage Vdrop. Thus, the time period during which the output of driver 1 is decreased to zero is less than the time period during which output voltage VOUT is increased to VIN1 by driver 2. As a result, the occurrence of the output voltage being greater than the first input voltage even the switches of the first switching circuit are not off can be substantially avoided, so as to prevent the current from flowing back to the first input terminal from output OUT.

From time t4 to time t5, reference voltage signal SST_ref may continue rising to VIN2, and feedback voltage OP1_OUT can continue rising until switches Q3 and Q4 are completely turned on by driver 2. Output voltage VOUT can reach input voltage VIN2, and thus the switching operation from the first switching circuit to the second switching circuit may be complete. At time t6, operation signal "Order" can indicate that the first switching circuit is to be enabled, order signal CS_Order can indicate channel CH1_ON, and trigger signal EN_tra may go active high. Based on a similar procedure, reference voltage signal SST_ref can begin to decrease by discharging, and feedback control signal OP1_OUT can accordingly decrease. Discharge circuit 45 may be enabled, discharge switch Qdis can turn on, and the discharge resistor can discharge output voltage VOUT such that output voltage VOUT decreases.

At time t7, output voltage VOUT can be decreased to a difference between VIN1 and Vdrop, feedback control signal OP2_OUT may go active high, and the channel selection circuit 44 can couple feedback control signal OP1_OUT to driver 1, and feedback control signal OP2_OUT to driver 2. Also, reference voltage signal SST_ref can be decreased to zero. From time t7 to t8, reference voltage signal SST_ref may gradually rise, and the output of driver 1 can also gradually rise in the function of feedback control signal OP1_OUT, such that switches Q1 and Q2 of the first switching circuit can be started softly. At the same time, output voltage OUT may remain at the value of VIN1−Vdrop.

At time t8, reference voltage signal SST_ref can rise to a certain value (e.g., VIN1−Vdrop), and the output of driver 1 can increase. Switches Q1 and Q2 of the first switching circuit may be gradually turned on, and finally, output voltage VOUT may be greater than the difference between VIN1 and Vdrop. When output voltage VOUT reaches the difference between VIN1 and Vdrop, feedback control signal OP2_OUT may be deactivated, the output of the driver 2 can be gradually decreased to zero, and the switches of the second switching circuit may be off. From time t8 to t9, output voltage VOUT may gradually rise by the control of feedback control signal OP1_OUT, and reach the level of VIN1 at time t9, whereby switches Q1 and Q2 of the first switching circuit are fully on. In this way, the system can be switched from the second switching circuit to the first switching circuit, and the output voltage may remain almost stable without any substantial voltage drop during the switching procedure.

At time t10, the order signal Order may indicate that the system is to be off, the reference voltage signal SST_ref may begin to linearly decrease. The discharge circuit can be enabled, and the discharge resistor can discharge output voltage VOUT until output voltage VOUT is decreased to zero. Channel selection circuit 44 may disconnect feedback control signal OP2_OUT from driver 2, and also disconnect feedback control signal OP1_OUT from driver 1. At time t12, the system can be disabled.

According to the above switching control circuits and methods, when different input power sources are to be switched, the logic control circuit may output the order signal for switching, the reference voltage signal can receive the order signal, the trigger signal, and the second feedback control signal, in order to regulate the reference voltage signal based on the different input voltages. In this way, the output voltage can be controlled to change slowly and steadily until reaching a level of the expected output voltage, in order to substantially guarantee that the output voltage does not drop and remains stable during the switching between different channels.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A switching control circuit for controlling a multi-channel switching circuit having input terminals respectively coupled to a plurality of input voltages, and output terminals coupled to an output terminal to provide an output voltage signal, the switching control circuit comprising:
   a) a logic control circuit configured to receive an external operation signal, and to generate an enable signal, a trigger signal, and an order signal;
   b) a reference voltage regulation circuit configured to receive said enable signal, said trigger signal, said order signal, and a plurality of input voltage signals, and to generate an adjustable reference voltage signal, wherein said reference voltage regulation circuit is configured to select one of said plurality of input voltage signals based on said order signal;
   c) a feedback control circuit configured to receive said reference voltage signal, said plurality of input voltage signals, and said output voltage signal, and to generate a feedback control signal; and
   d) a channel selection circuit configured to receive said order signal and said feedback control signal, and to generate switching control signals to control switching operations of said multi-channel switching circuit.

2. The switching control circuit of claim 1, wherein said feedback control circuit comprises:
   a) a first feedback circuit comprising a first operational amplifier configured to receive said output voltage signal and said reference voltage signal, and to generate a first feedback control signal; and
   b) a second feedback circuit comprises a second operational amplifier configured to receive said output voltage signal and a minimum value of said input voltage signals, and to generate a second feedback control signal, wherein said minimum value of said input voltage signals is the minimum one of two input voltage signals to be switched.

3. The switching control circuit of claim 2, wherein said adjustable reference voltage signal is generated by a reference voltage regulation circuit comprising:
 a) a logic controller configured to receive said enable signal, said trigger signal, said order signal, and said second feedback control signal, and to generate a charge signal and a discharge signal;
 b) a multiple-channel selection circuit configured to select one of said input voltage signals according to said order signal;
 c) a charge and discharge circuit comprising a charge current source, a discharge current source, a first switch, and a first capacitor, wherein said charge current source has a first terminal coupled to said output terminal, and a second terminal coupled to a first terminal of said first capacitor;
 d) said discharge current source being coupled in parallel with said first switch and said first capacitor, and wherein a second terminal of said first capacitor is grounded;
 e) said charge current source being configured to receive said charge signal, and to charge said first capacitor when said charge signal is active; and
 f) said discharge current source being configured to receive said discharge signal, and to discharge said first capacitor when said discharge signal is active.

4. The switching control circuit of claim 2, wherein said second feedback circuit is configured to receive said trigger signal, and to be disabled when said trigger signal is inactive.

5. The switching control circuit of claim 2, wherein said feedback control circuit further comprises a first voltage source having a cathode coupled to said output terminal, and an anode coupled to an inverting input terminal of said first operational amplifier.

6. The switching control circuit of claim 1, wherein said switching control circuit further comprises a discharge circuit having a discharge resistor and a discharge switch that are coupled in series between said output terminal and ground, wherein said discharge switch is controlled by a discharge control signal generated by said logic control circuit.

7. The switching control circuit of claim 1, wherein said channel selection circuit comprises a multiplexer.

8. A method of controlling a multi-channel switching circuit having input terminals respectively coupled to a plurality of input voltages, and output terminals coupled to an output terminal to provide an output voltage signal, the method comprising:
 a) receiving an operation signal, and generating an enable signal, a trigger signal, and an order signal;
 b) generating an adjustable reference voltage signal based on said enable signal, said trigger signal, said order signal, and said plurality of input voltage signals;
 c) selecting one of said input voltage signals according to said order signal;
 d) generating a feedback control signal in response to said reference voltage signal, said plurality of input voltage signals, and said output voltage signal; and
 e) generating switching control signals to control the switches of said multi-channel switching circuit in response to said order signal and said feedback control signal.

9. The method of claim 8, wherein said generating said feedback control signal comprises:
 a) generating, by a first operational amplifier, a first feedback control signal, wherein said first operational amplifier receives said output voltage signal and said reference voltage signal; and
 b) generating, by a second operational amplifier, a second feedback control signal, wherein said second operational amplifier receives said output voltage signal and a minimum value of said input voltage signals, wherein said minimum value of said input voltage signals is the minimum one of two input voltage signals to be switched currently.

10. The method of claim 9, wherein said generating said adjustable reference voltage signal comprises:
 a) generating a charge signal and a discharge signal in response to said enable signal, said trigger signal, said order signal, and said second feedback control signal;
 b) coupling said selected input voltage signal to a charge current source;
 c) charging, by said charge current source, a first capacitor when said charge signal is active; and
 d) discharging, by a discharge current source said first capacitor when said discharge signal is active, wherein a voltage across said first capacitor is configured as said reference voltage signal.

* * * * *

UNITED STATES PATENT AND TRADEMARK OFFICE
CERTIFICATE OF CORRECTION

PATENT NO. : 9,882,486 B2  
APPLICATION NO. : 15/446133  
DATED : January 30, 2018  
INVENTOR(S) : Li Page 1 of 1

It is certified that error appears in the above-identified patent and that said Letters Patent is hereby corrected as shown below:

On the Title Page

Item (30), should read as:  
March 4, 2016   1 0123766.8

Signed and Sealed this  
Twenty-ninth Day of January, 2019

Andrei Iancu  
*Director of the United States Patent and Trademark Office*